(12) United States Patent
Doong et al.

(10) Patent No.: US 11,227,778 B2
(45) Date of Patent: Jan. 18, 2022

(54) WAFER CLEANING APPARATUS AND OPERATION METHOD OF THE SAME

(71) Applicant: NANYA TECHNOLOGY CORPORATION, New Taipei (TW)

(72) Inventors: Shyue-Ru Doong, Taipei (TW); Feng-Ju Tsai, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 92 days.

(21) Appl. No.: 16/537,638

(22) Filed: Aug. 12, 2019

(65) Prior Publication Data
US 2021/0050232 A1 Feb. 18, 2021

(51) Int. Cl.
| | |
|---|---|
| *H01L 21/67* | (2006.01) |
| *B08B 3/02* | (2006.01) |
| *H01L 21/02* | (2006.01) |

(52) U.S. Cl.
CPC .......... *H01L 21/67051* (2013.01); *B08B 3/02* (2013.01); *H01L 21/02041* (2013.01)

(58) Field of Classification Search
CPC ................... H01L 21/67051; H01L 21/02041; B08B 3/02
See application file for complete search history.

(56) References Cited

U.S. PATENT DOCUMENTS

| | | | | |
|---|---|---|---|---|
| 6,135,702 A | * | 10/2000 | Huang | ..................... B25J 19/06 414/729 |
| 7,105,847 B2 | * | 9/2006 | Oka | ................... H01L 21/67265 250/559.29 |
| 2002/0021959 A1 | * | 2/2002 | Schauer | ............ H01L 21/67265 414/744.2 |
| 2008/0060686 A1 | * | 3/2008 | Miya | ................. H01L 21/67109 134/37 |
| 2011/0079252 A1 | * | 4/2011 | Minamida | ........... H01L 21/6719 134/94.1 |
| 2012/0180828 A1 | * | 7/2012 | Higashijima | ..... H01L 21/68728 134/198 |
| 2013/0325179 A1 | * | 12/2013 | Liao | .................. H01L 21/67259 700/254 |
| 2015/0013722 A1 | * | 1/2015 | Amano | ................... B08B 13/00 134/18 |
| 2016/0351420 A1 | * | 12/2016 | Kao | ................... H01L 21/67288 |
| 2017/0285609 A1 | * | 10/2017 | Isokawa | ............ H01L 21/67259 |
| 2018/0161828 A1 | * | 6/2018 | Yang | ................. H01L 21/67253 |

FOREIGN PATENT DOCUMENTS

| | | | | |
|---|---|---|---|---|
| JP | 2000012417 | A | * | 1/2000 |
| KR | 20100048396 | A | * | 5/2010 |
| KR | 20100137363 | A | * | 12/2010 |
| KR | 20120116351 | A | * | 10/2012 |
| KR | 20180119139 | A | * | 11/2018 |
| TW | 200523065 | A | | 7/2005 |
| TW | 201802864 | A | | 1/2018 |

\* cited by examiner

*Primary Examiner* — Michael E Barr
*Assistant Examiner* — Pallavi Chitta
(74) *Attorney, Agent, or Firm* — CKC & Partners Co., LLC

(57) ABSTRACT

A wafer cleaning apparatus includes a spin base, a first arm, and a second arm. The spin base is configured to support a wafer. The first arm is disposed above the spin base and configured to supply a chemical solution. The second arm is movably positioned above the spin base, and the second arm is configured to supply a first cleaning solution above the spin base when the first arm abnormally stops supplying the chemical solution.

6 Claims, 5 Drawing Sheets

WAFER CLEANING APPARATUS AND OPERATION METHOD OF THE SAME

BACKGROUND

Field of Invention

The present invention relates to a wafer cleaning apparatus and a method of operating a wafer cleaning apparatus.

Description of Related Art

For a typical wafer processing apparatus, the arm that supplies chemical solution may abnormally stop due to mechanical problem. If the arm cannot be moved, the following process may be stopped and the chemical solution on the wafer cannot be removed. Therefore, the chemical solution may over etch the wafer and damage the wafer surface. Accordingly, there is a need to construct a wafer cleaning tool that can remove the chemical solution when the arm that supplies chemical solution abnormally stops.

SUMMARY

The invention provides a wafer cleaning apparatus.

In some embodiments, the wafer cleaning apparatus includes a spin base, a first arm, and a second arm. The spin base is configured to support a wafer. The first arm is disposed above the spin base and configured to supply a chemical solution. The second arm is movably positioned above the spin base, and the second arm is configured to supply a first cleaning solution above the spin base when the first arm abnormally stops supplying the chemical solution.

In some embodiments, when the first arm abnormally stops supplying the chemical solution, the second arm is located between the first arm and the spin base.

In some embodiments, when the first arm abnormally stops supplying the chemical solution, the second arm is overlapped with the first arm.

In some embodiments, the second arm further includes a sensor configured to detect a position of the first arm through Infrared detection.

In some embodiments, the sensor is configured to detect a distance between the first arm and the second arm.

In some embodiments, the sensor is configured to detect a height of the first arm relative to the spin base.

In some embodiments, the wafer cleaning apparatus further includes a first motor configured to drive the first arm.

In some embodiments, the wafer cleaning apparatus further includes a second motor configured to drive the second arm.

In some embodiments, the second motor is configured to adjust the height and a position of the second arm.

In some embodiments, the first cleaning solution includes deionized water (DI water) or isopropyl alcohol (IPA).

In some embodiments, the second arm further includes a first solution pipe therein, and the first solution pipe is configured to transport the first cleaning solution.

In some embodiments, the second arm further includes a second solution pipe, and the second solution pipe is configured to transport a second cleaning solution.

The invention provides a method of operating a wafer cleaning apparatus.

The method includes transmitting a signal to a sensor of a second arm of the wafer cleaning apparatus by a controller when a first arm of the wafer cleaning apparatus abnormally stops; detecting a position of the first arm by the sensor; moving the second arm based on a detection result from the sensor; and supplying a first cleaning solution by the second arm.

In some embodiments, detecting the position of the first arm is performed by Infrared detection.

In some embodiments, the second arm is moved by a motor.

In some embodiments, moving the second arm includes adjusting a height and a position of the second arm.

In some embodiments, detecting the position of the first arm includes detecting a distance between the first arm and the second arm.

In some embodiments, detecting the position of the first arm includes detecting a height of the first arm relative to the spin base.

In the aforementioned embodiments, when the first arms supplying the chemical solution abnormally stops, the second arm of the wafer cleaning apparatus may supply the first cleaning solution to clean the wafer. Therefore, the damage of the wafer can be avoided. Furthermore, since the wafer cleaning apparatus is applied for single wafer, the second arm can be controlled to supply the first cleaning solution immediately when the abnormal stopping of the first arm occurred.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
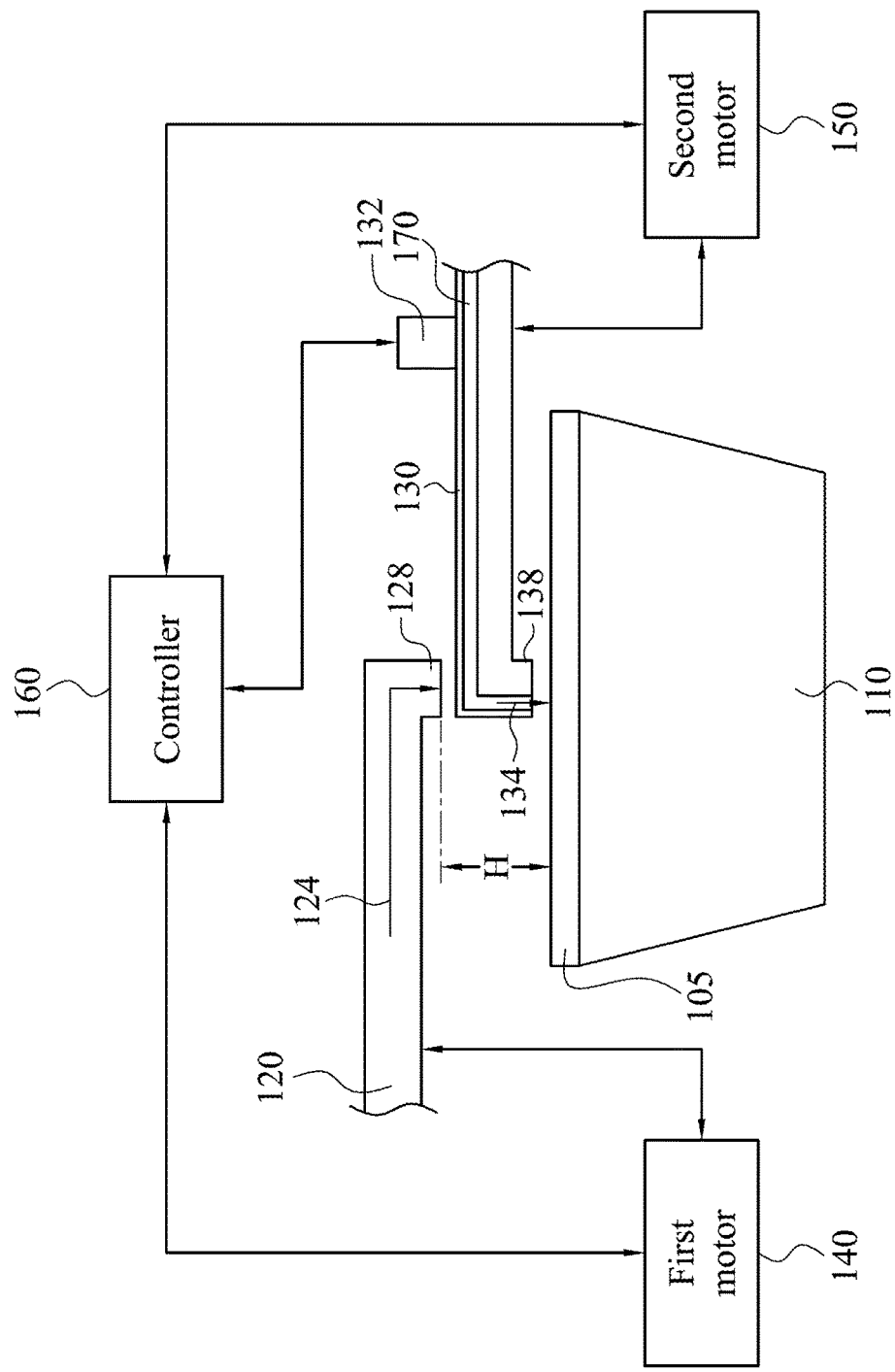
FIG. 1 is side view of a wafer cleaning apparatus according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is side view of a wafer cleaning apparatus 100 according to some embodiments of the present disclosure. The wafer cleaning apparatus 100 includes a spin base 110, a first arm 120, and a second arm 130. The spin base 110 is configured to support a wafer 105. The first arm 120 is disposed above the spin base 110 and is configured to supply a chemical solution 124. The second arm 130 is movably positioned above the spin base 110. When the first arm 120 abnormally stops moving and stops supplying the chemical solution 124, the second arm 130 can supply a first cleaning solution 134 on the wafer 105. The chemical solution 124, for example, is used to etch the wafer 105 to form a pattern. The first cleaning solution 134 is used to wash away the chemical solution 124.

Particularly, when the first arm 120 stops abnormally, the process flow may be stopped. That is, the first arm 120 may stop supplying the chemical solution 124, and the following process cannot be performed. For example, the first arm 120 may supply deionized water (DI water) or isopropyl alcohol (IPA) in the subsequent process. In other words, the chemical solution 124 cannot be removed immediately after the reaction time. As a result, the chemical solution 124 may damage the wafer 105. Therefore, when the first arm 120 abnormally stops supplying the chemical solution 125, the second arm 130 can be moved to a position between the first arm 120 and the spin base 110. In some embodiments, the second arm 130 is overlapped with the first arm 120. The wafer cleaning apparatus 100 in FIG. 1 is at the state when the first arm 120 abnormally stops. With such configuration, the second arm 120 may supply cleaning solution (for example, DI water or IPA) to clean the wafer 105 such that the damage of the wafer 105 can be avoid.

In the present embodiment, the wafer cleaning apparatus 100 is a single wafer apparatus. That is, the first arm 120 and the second arm 130 are configured to respectively supply the chemical solution 124 and first cleaning solution 134 only for the wafer 105 disposed on the specific spin base 110. With such configuration, the second arm 130 can be controlled to supply the first cleaning solution 134 immediately when the abnormal stopping of the first arm 120 occurred.

In some embodiments, the wafer cleaning apparatus 100 further includes a first motor 140, a second motor 150, and a controller 160. The first motor 140 and the second motor 150 are electrically connected to the controller 160. The first motor 140 is electrically connected to the first arm 120 and is configured to drive the first arm 120. The second motor 150 is electrically connected to the second arm 130 and is configured to drive the second arm 130. The second arm 130 further includes a sensor 132 electrically connected to the controller 160 and is configured to detect a position of the first arm 120 through Infrared detection. The second motor 150 is configured to adjust a height and a position of the second arm 130 based on the detection result from the sensor 132.

Figure 2:
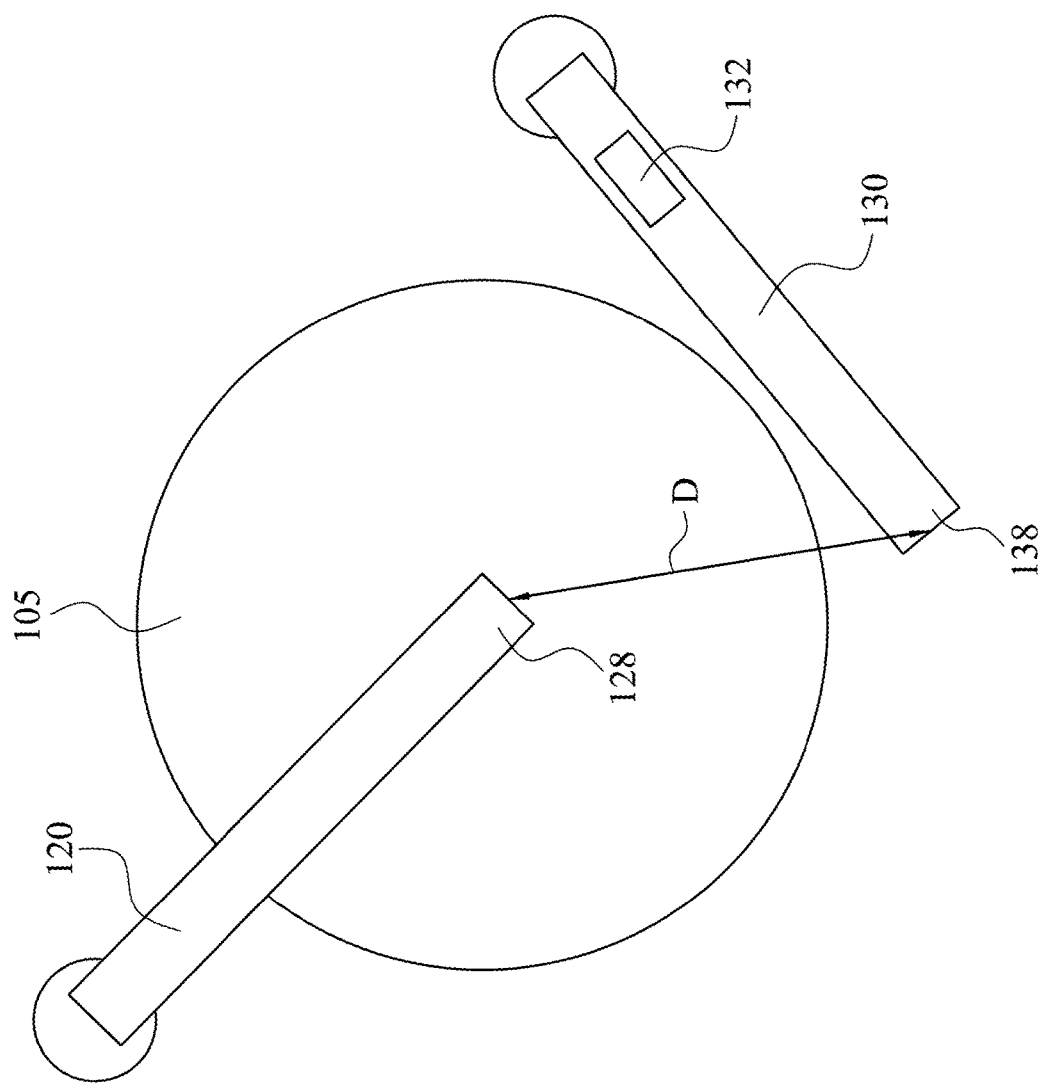
FIG. 2 is a top view of the wafer cleaning apparatus of FIG. 1 when the first arm supplies an chemical solution normally.

FIG. 2 is a top view of the wafer cleaning apparatus 100 of FIG. 1 when the first arm 120 supplies the chemical solution 124 normally. As shown in FIGS. 1 and 2, when the first arm 120 supplies the chemical solution 124 normally, the second arm 130 is located adjacent to the spin base 110 and is not located between the first arm 120 and the wafer 105.

Particularly, for example, crash of the first motor 140 may result in the abnormal stopping of the first arm 120. The abnormal stopping may trigger the controller 160 to transmit a signal to the second motor 150 and the sensor 132 of the second arm 134. Accordingly, the sensor 134 of the second arm 130 may perform Infrared detection, and the second motor 150 may drive the second arm 130 based on a result of the infrared detection.

For example, as shown in FIG. 1, the sensor 132 is configured to detect a height H of the first arm 120 relative to the spin base 110 or the wafer 105. In the present embodiment, height H represents the distance between the first arm 120 and a top surface of the water 105. The height H detected by the sensor 134 is transmitted to the controller 160, and the controller 160 may control the second motor 150 to adjust the height of the second arm 130.

Similarly, as shown in FIG. 1 and FIG. 2, the sensor 132 is configured to detect a distance D between the first arm 120 and the second arm 130. The first arm 120 includes a first nozzle 128, and the second arm 130 includes a second nozzle 138. In some embodiments, the first nozzle 128 is driven to be located substantially above the center of the wafer 105 or the spin base 110. Distance D represents the distance between the first nozzle 128 and the second nozzle 138. The distance D detected by the sensor 134 is transmitted to the controller 160, and the controller 160 may control the second motor 150 to adjust the position of the second arm 130.

Figure 3:
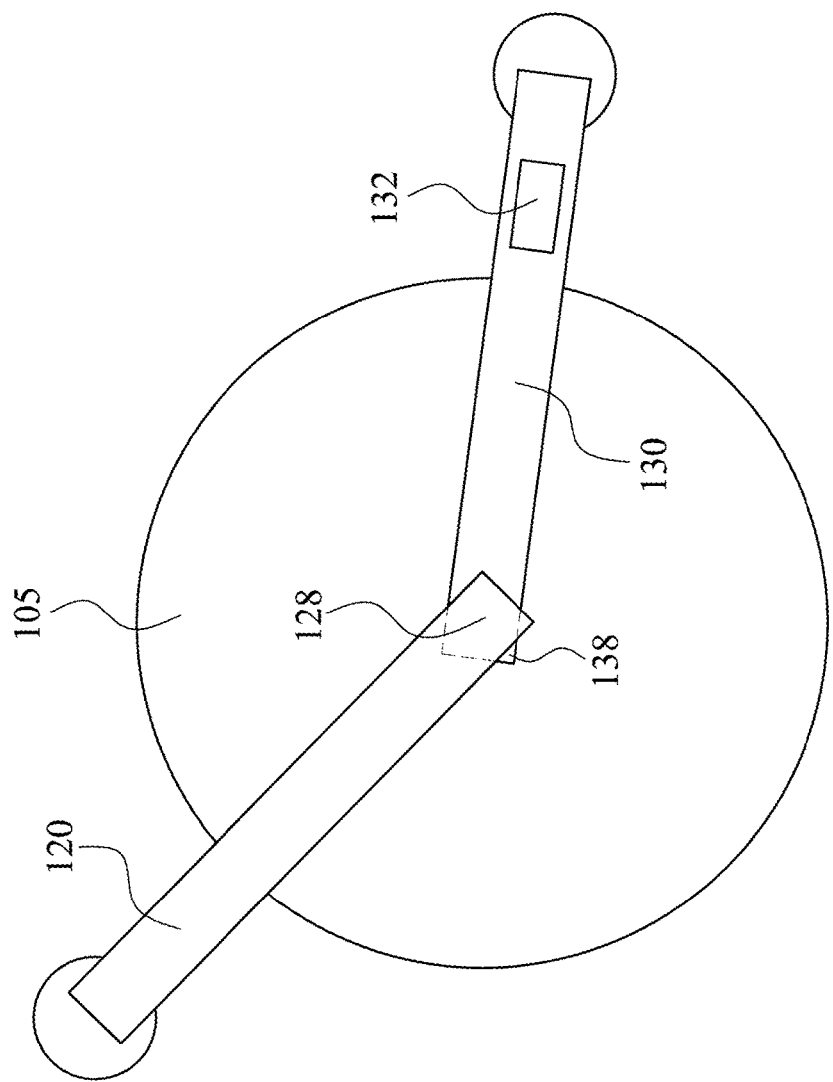
FIG. 3 is a top view of the wafer cleaning apparatus of FIG. 1 when the first arm abnormally stops supplying the chemical solution.

FIG. 3 is a top view of the wafer cleaning apparatus 100 of FIG. 1 when the first arm 120 abnormally stops supplying the chemical solution 124. As shown in FIGS. 1 and 3, the second arm 130 may be rotated by the second motor 150. In some other embodiments, the second arm 130 may be controlled by the second motor 150 to move translationally.

As such, as shown in FIG. 1 and FIG. 3, the second motor 150 adjust the height and the position of the second arm 130 such that the second arm 130 is moved to be located between the first arm 120 and the spin base 110 and be overlapped with the first arm 120. Accordingly, the second arm 130 can be moved without crashing with the first arm 120. Furthermore, the second nozzle 138 is overlapped with the first nozzle 128, such that the first cleaning solution 134 can be supplied directly at the region on which the chemical solution 128 is dropped.

Reference is made to FIG. 1, the second arm 130 further includes a first solution pipe 170, and the first solution pipe 170 is located in the second arm 130. The first solution pipe 170 is configured to transport the first cleaning solution 134. In some embodiments, the first cleaning solution 134 may be deionized water (DI water) or isopropyl alcohol (IPA), which can be predetermined by the user or can be determined by the controller 160 based on the process flow. As such, the remaining chemical solution 124 on the wafer 105 can be removed by the first cleaning solution 134.

Specifically, in some embodiments, the wafer cleaning apparatus 100 may further include another sensor (not shown) electrically connected to the controller 160 and is configured to detect a characteristic of the surface of the wafer 105. As such, the controller 160 may further control the amount of the first cleaning solution 134 that is needed to clean the wafer 105.

Figure 4:
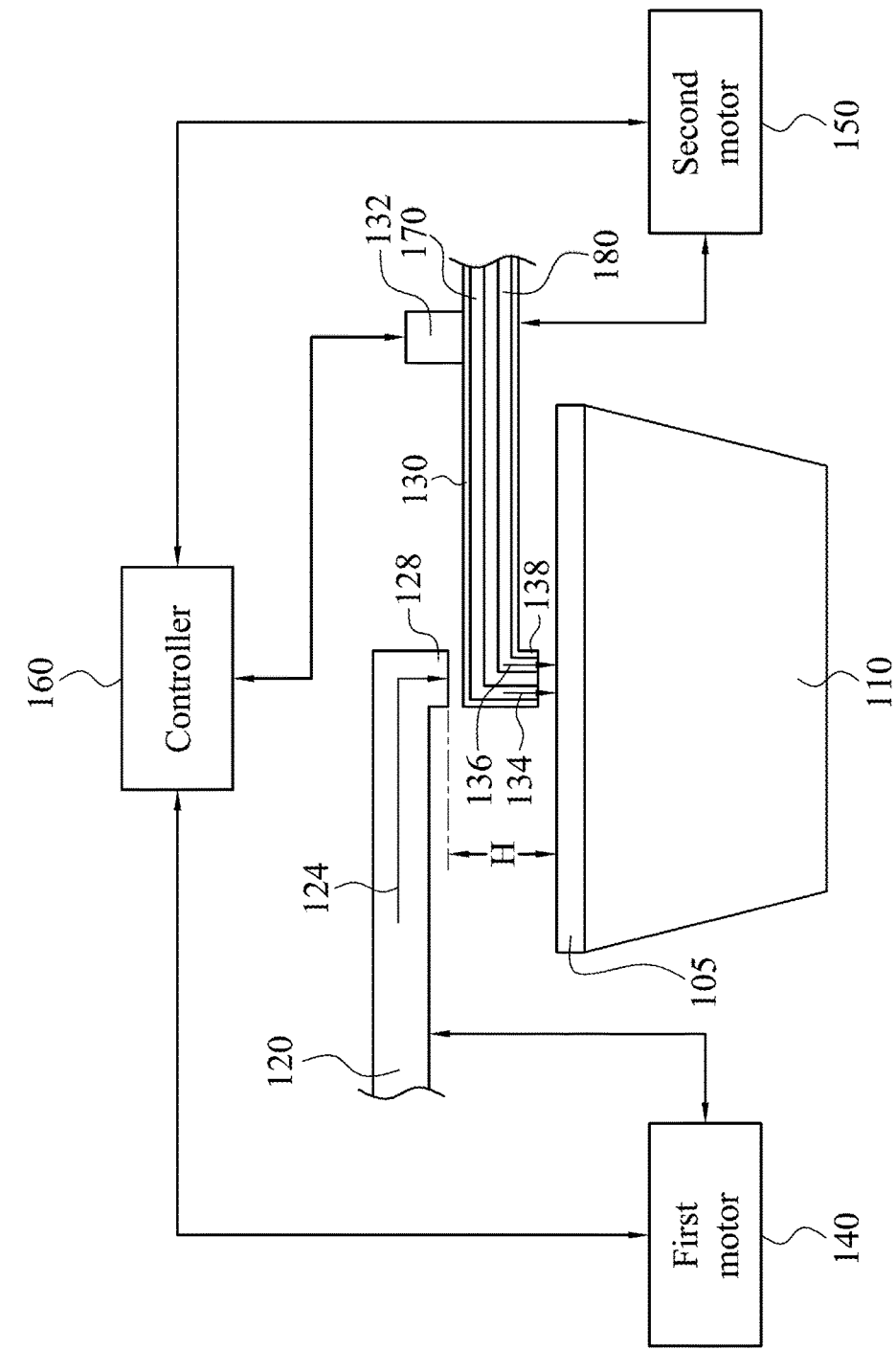
FIG. 4 is side view of another wafer cleaning apparatus according to some embodiments of the present disclosure.
Figure 5:
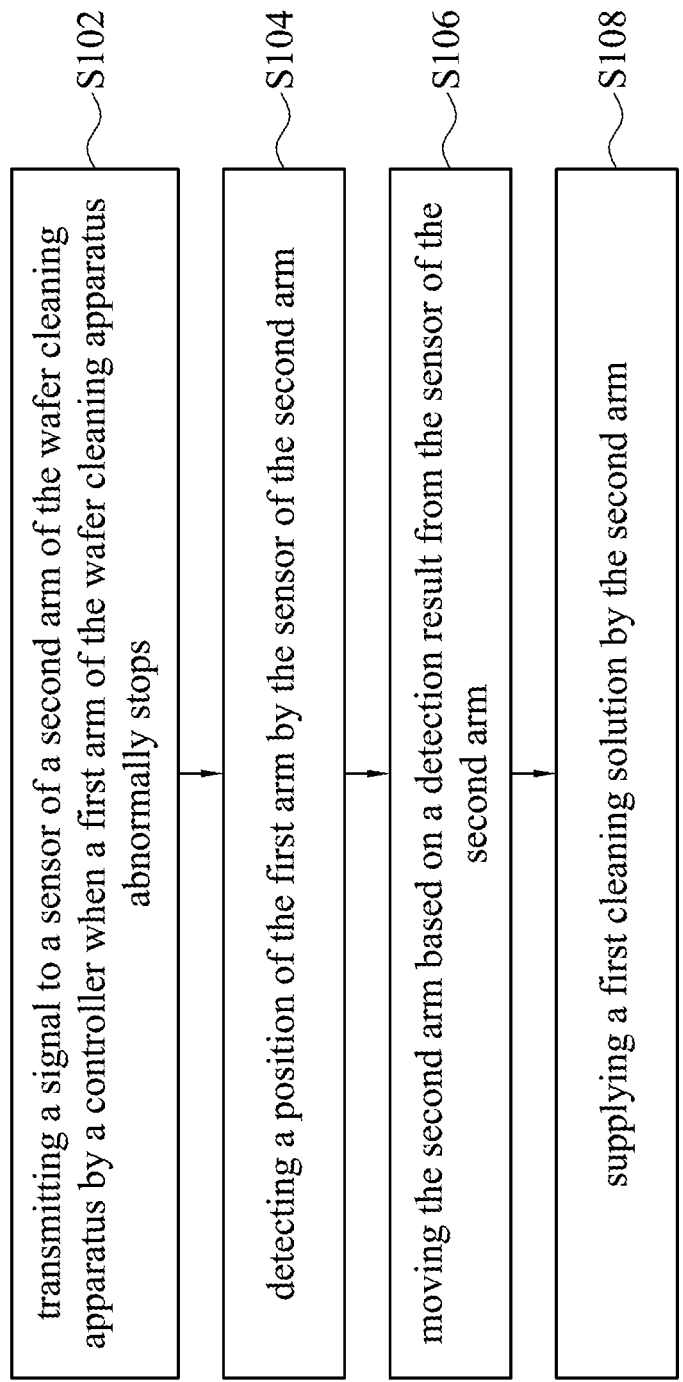
FIG. 5 is a flow chart of a method of operating a wafer cleaning apparatus according to some embodiments of the present disclosure.

FIG. 4 is side view of another wafer cleaning apparatus 100a according to some embodiments of the present disclosure. The wafer cleaning apparatus 100a is similar to the wafer cleaning apparatus 100, and the difference is that the wafer cleaning apparatus 100a further includes a second solution pipe 180 located in the first arm 130. The second solution pipe 180 is separated from the first solution pipe 170 and is configured to transport the second cleaning solution 136. In the present embodiment, the first pipe 170 and the second pipe 180 may respectively supply DI water and IPA, but the disclosure is not limited in this regard.

Similarly, the amount of the first cleaning solution 134 and the second cleaning solution 136 may be determined by the controller 160 based on the process flow and the characteristic of the surface of the wafer 105 detected by another sensor.

FIG. 4 is side view of another wafer cleaning apparatus according to some embodiments of the present disclosure. Reference is made to FIGS. 1 and 4. The method starts with step S102 in which a signal is transmitted by the controller 160 to the sensor 132 of the second arm 130 when the first arm 120 abnormally stops. In some embodiments, the abnormal stopping of the first arm 120 may be caused by a crash of the first motor 150. Thereafter, in step S104, the position of the first arm 120 is detected by the sensor 132 of the second arm 130 by Infrared detection. In some embodiments, the position of the first arm 120 may include a distance D (see FIG. 2) between the first arm and the second arm or a height H of the first arm relative to the spin base. Afterwards, in step S106, the second arm 130 is moved by the second motor 160 based on the detection result from the sensor 132 of the second arm 130. In some embodiments, the second motor 150 can adjust the height and the position of the second arm 130. Subsequently, in step S108, the first cleaning solution 134 may supplied by the second arm 130 to clean the wafer 105. In some embodiments, the second arm 130 may supply first cleaning solution 134 and the second cleaning solution 136.

As mentioned above, the second arm 130 of the wafer cleaning apparatus may supply first cleaning solution 134 and second cleaning solution 136 to clean the wafer 105 such that the damage of the wafer 105 can be avoid. The second motor 150 can adjust the height and the position of the second arm 130 based on a detection result of the sensor 132 such that the second arm 130 is moved without crashing with the first arm 120. Furthermore, since the wafer cleaning apparatus is applied for single wafer, the second arm 130 can be controlled to supply first cleaning solution 134 (and second cleaning solution 136) immediately when the abnormal stopping of the first arm 120 occurred.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of operating a wafer cleaning apparatus, comprising:
   transmitting a signal to a sensor of a second arm of the wafer cleaning apparatus by a controller when a first arm of the wafer cleaning apparatus stops;
   detecting a position of the first arm by the sensor of the second arm;
   moving the second arm based on a detection result from the sensor of the second arm; and
   supplying a first cleaning solution by the second arm.

2. The method of claim 1, wherein detecting the position of the first arm is performed by infrared detection.

3. The method of claim 1, wherein the second arm is moved by a motor.

4. The method of claim 1, wherein moving the second arm comprises adjusting a height and a position of the second arm.

5. The method of claim 1, wherein detecting the position of the first arm comprises detecting a distance between the first arm and the second arm by the sensor of the second arm.

6. The method of claim 1, wherein detecting the position of the first arm comprises detecting a height of the first arm relative to a spin base by the sensor of the second arm.

* * * * *